United States Patent
Okada et al.

(10) Patent No.: US 6,483,989 B1
(45) Date of Patent: Nov. 19, 2002

(54) SUBSTRATE PROCESSING APPARATUS AND SEMICONDUCTOR DEVICE PRODUCING METHOD

(75) Inventors: Satoshi Okada, Tokyo (JP); Michiko Nishiwaki, Hamura (JP); Katsuhisa Kasanami, Tokyo (JP); Eisuke Nishitani, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 10/035,809

(22) Filed: Nov. 8, 2001

(30) Foreign Application Priority Data

Nov. 21, 2000 (JP) .......................... 2000-354366

(51) Int. Cl.⁷ .................................. F26B 3/30
(52) U.S. Cl. .................. 392/418; 392/416; 219/390; 219/405; 219/444.1; 118/728; 118/724; 118/729; 118/730
(58) Field of Search ................. 219/390, 405, 219/411, 444.1; 392/416, 418; 118/724, 725, 728, 729, 730, 50.1

(56) References Cited

U.S. PATENT DOCUMENTS

| | | | | |
|---|---|---|---|---|
| 6,188,044 B1 | * | 2/2001 | Lee et al. | 219/390 |
| 6,225,601 B1 | * | 5/2001 | Beer et al. | 219/390 |
| 6,343,183 B1 | * | 1/2002 | Halpin et al. | 392/416 |
| 6,353,209 B1 | * | 3/2002 | Schaper et al. | 219/444.1 |
| 6,403,479 B1 | * | 6/2002 | Watanabe et al. | 438/680 |

FOREIGN PATENT DOCUMENTS

| | | |
|---|---|---|
| JP | 5-57840 | 7/1993 |
| JP | 10-041235 | 2/1998 |

* cited by examiner

*Primary Examiner*—Teresa Walberg
*Assistant Examiner*—Shawntina T. Fuqua
(74) *Attorney, Agent, or Firm*—Hogan & Hartson, LLP

(57) ABSTRACT

A substrate processing apparatus is disclosed for heating a substrate by a heater through a susceptor in a state in which the substrate is placed on the susceptor, to process the substrate. The heater is divided into a plurality of respectively controlled zone heaters to form gaps therebetween, a center position of a gap of the gaps which is positioned closer to an end of the substrate than any other gap is located in a range from an inner side 10 mm to an outer side 6 mm in a radial direction of the substrate with respect to the end of the substrate.

7 Claims, 3 Drawing Sheets

SUBSTRATE PROCESSING APPARATUS AND SEMICONDUCTOR DEVICE PRODUCING METHOD

BACKGROUND OF THE INVENTION

1. Field of the Invention

The present invention relates to a substrate processing apparatus and a producing method of a semiconductor device, and more particularly, to a single wafer-feeding type semiconductor producing apparatus for heating a semiconductor wafer by a heater through a susceptor in a state in which the semiconductor wafer is placed on the susceptor, thereby processing the semiconductor wafer, and the invention also more particularly relates to a producing method of a semiconductor device having a step of processing a semiconductor wafer using this semiconductor producing apparatus.

2. Description of the Related Art

To obtain heat uniformity over the entire surface of a wafer, heat uniformity of a susceptor on which the wafer is placed is important. To obtain the heat uniformity of the susceptor, if a heater which is greater than the wafer in size is used, the heat uniformity can be obtained but it is expensive. If a heater which is as small as possible is used on the other hand, escape of heat from outer periphery becomes a problem, and the heat uniformity can not be obtained. The susceptor and the heater have a hole through which a push-up pin for transferring the wafer passes, and the heat escapes from a heater electrode, which causes deterioration of the heat uniformity.

SUMMARY OF THE INVENTION

It is, therefore, an object of the present invention to provide a substrate processing apparatus and a producing method of a semiconductor device capable of enhancing the heat uniformity over the entire surface of a substrate without increasing a size of a heater.

According to a first aspect of the present invention, there is provided a substrate processing apparatus for heating a substrate by a heater through a susceptor in a state in which the substrate is placed on the susceptor, thereby processing the substrate, wherein the heater is divided into a plurality of respectively controlled zone heaters to form gaps therebetween, a center position of a gap of the gaps which is positioned closer to an end of the substrate than any other gap is located in a range from an inner side 10 mm to an outer side 6 mm in a radial direction of the substrate with respect to the end of the substrate.

Preferably, the center position of the gap is located in a range of an inner side 5 mm to the end of the substrate in the radial direction of the substrate with respect to the end of the substrate.

Preferably, the center position of the gap is located at the end of the substrate.

Preferably, the susceptor is divided into a plurality of divided susceptors, and divided ends of the zone heaters are respectively located in a range of 5 to 10 mm from the divided ends on the substrate side of the respectively corresponding divided susceptors.

Preferably, the divided susceptors have an outer peripheral susceptor which is to be located at an outer periphery of the substrate, and a member made of quartz is provided on or above the outer peripheral susceptor.

According to a second aspect of the present invention, there is provided a producing method of a semiconductor device, comprising a step of heating a substrate by a heater through a susceptor in a state in which the substrate is placed on the susceptor, thereby processing the substrate, wherein the heater is divided into a plurality of respectively controlled zone heaters to form gaps therebetween, a center position of a gap of the gaps which is positioned closer to an end of the substrate than any other gap is located in a range from an inner side 10 mm to an outer side 6 mm in a radial direction of the substrate with respect to the end of the substrate.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
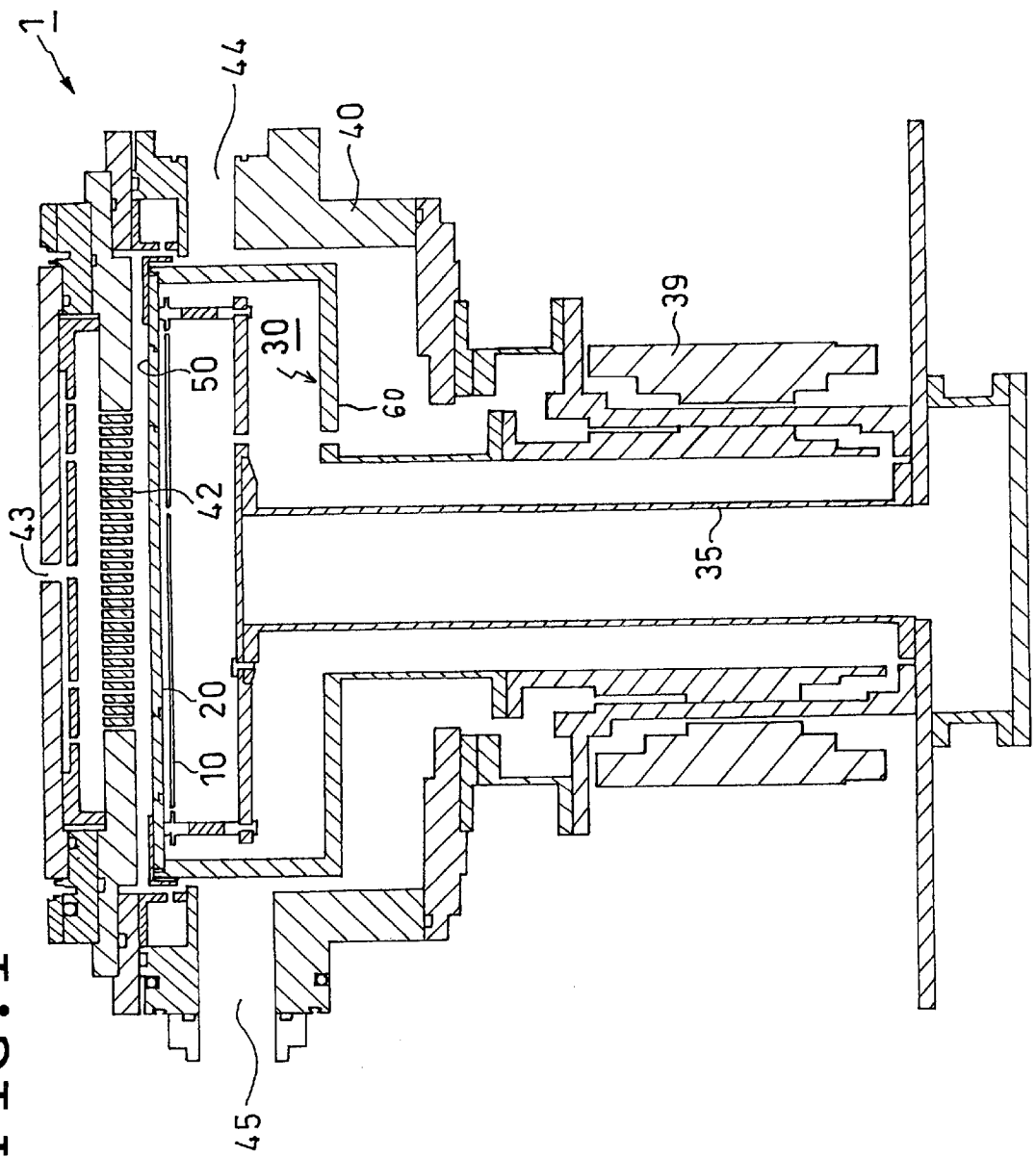
FIG. 1 is a schematic longitudinal sectional view for explaining a semiconductor wafer processing apparatus according to one embodiment of the present invention.
Figure 2:
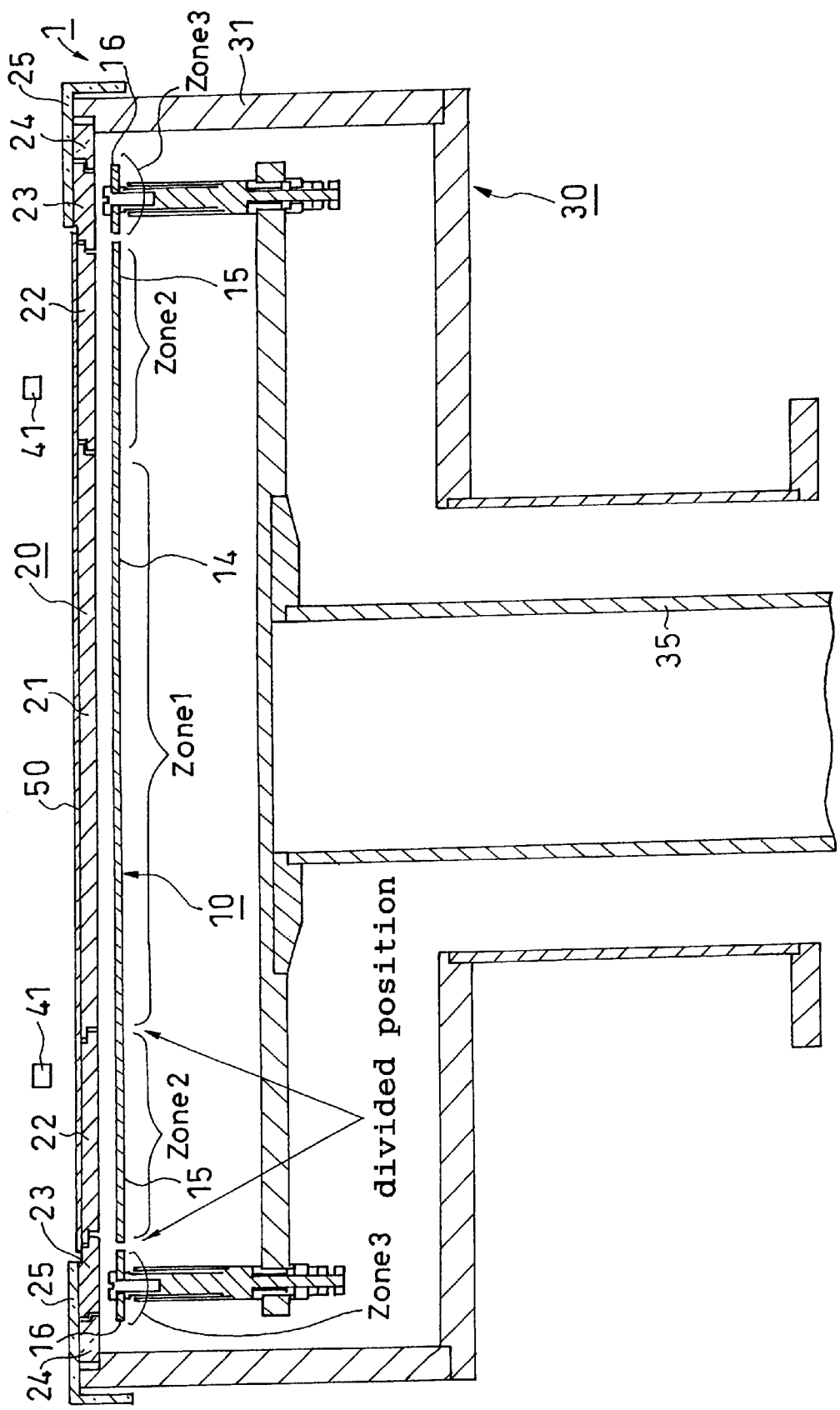
FIG. 2 is a partially enlarged schematic longitudinal sectional view for explaining the semiconductor wafer processing apparatus according to the one embodiment of the present invention.

FIG. 1 is a schematic longitudinal sectional view for explaining a semiconductor wafer processing apparatus according to one embodiment of the present invention, and FIG. 2 is a partially enlarged schematic longitudinal sectional view of the semiconductor wafer processing apparatus.

A semiconductor wafer processing apparatus 1 of the present embodiment of the present invention comprises a reaction chamber 40, a susceptor 20 on which a semiconductor wafer 50 provided in the reaction chamber 40 is placed, a heater 10 provided below the susceptor 20, and a shower head 42. Reaction gas is supplied into the reaction chamber 40 in a manner of shower through a gas introducing port 43 and the shower head 42 and then, supplied onto the semiconductor wafer 50, and discharged from a discharging hole 44. The wafer 50 is transferred into and out from the reaction chamber 40 through a wafer transfer port 45.

A temperature across a surface of the wafer 50 is affected by a temperature of the susceptor 20. In order to secure the heat uniformity over the entire surface of the wafer, it is important to efficiently control a temperature of the susceptor 20. For this reason, the heater 10 is divided into three zone heaters 14, 15 and 16 in respective zones 1, 2 and 3, and the susceptor 20 is also divided into divided susceptors 21, 22 and 23 at positions corresponding to the respective divided positions at which the heater 10 is divided into the zones. An outer peripheral divided susceptor 24 is further provided at an outer portion of the outer peripheral divided susceptor 23. A temperature of the heater 10 is controlled by three systems, i.e., the zones 1 to 3.

The temperature control performance is enhanced by respectively controlling temperatures of the divided zone heaters. The positions where the heater 10 is divided into the zone heaters correspond to the positions where the susceptor 20 is divided. For example, when it is necessary to increase the temperature of only a center portion of the susceptor, it is possible to increase the temperature of only the zone heater 14 in the zone 1.

The divided susceptor 21 below the wafer 50 is lifted by a wafer transfer mechanism (not shown), and the lifted wafer 50 is transferred in and out by a wafer transfer plate 41.

In the case of the zone heater 16 in the outer peripheral zone 3, since heat thereof is dissipated outward, it is necessary to correspondingly increase a temperature of the heater 16 higher than those of the inner side zone heaters 15 and 14, and since a difference in temperature between the outer peripheral zone heater 16 and the inner side zone heater 15 is increased, the zone heaters 16 and 15 are physically separated from each other. Although temperatures of the zone heater 15 in the zone 2 and the zone heater 14 in the inner zone 1 are separately controlled, since a difference between the temperatures is small, heater patterns for the zone heaters 14 and 15 are disposed and formed on one plate.

The outer peripheral zone heater 16 is physically separated from the inner zone heater 15 as described above, and the difference in temperature between the outer peripheral zone heater 16 and the inner zone heaters 15 is great, and therefore, a divided position of the heater 10 between the outer peripheral zone heater 16 and the inner zone heater 15 have great effect on the heat uniformity of the susceptor 20, and by extension on the heat uniformity of the wafer 50 placed on the susceptor 20. Thereupon, a relation between the heat uniformity of the wafer 50 and the divided position between the outer peripheral zone heater 16 and the inner zone heater 15 was researched. A result thereof is shown in Table 1.

300 mm is used as the wafer 50, a temperature of the wafer is set to 650° C., a temperature of the zone heater 14 is set to 750° C., a temperature of the zone heater 15 is set to 753° C., and a temperature of the zone heater 16 is set to 850° C. The temperature difference of the wafer (max-min) means a difference between the highest temperature and the lowest temperature over the entire surface of the wafer 50.

Here, when a polycrystalline silicon film is formed for example, ±1% film thickness uniformity is required at a film forming rate of 200 nm/min for enhancing film quality. It is necessary that the heat uniformity of the wafer 50 in this case is ±0.5° C. over the entire surface of the wafer. To achieve this, it is preferable that the zone heater 15 and the zone heater 16 are divided at between a position 52 which is −10 mm from an outer peripheral end 51 of the wafer 50 in a radial direction of the wafer (position of 10 mm inward: a diameter is φ290 mm) to a position 53 which is +6 mm from the outer peripheral end 51 of the wafer 50 in the radial direction of the wafer (position of 6 mm outward: a diameter is φ306 mm), and more preferably, between −5 mm (5 mm inward) and 0 mm (position of a wafer end 51) from the outer peripheral end 51 of the wafer 50 in the radial direction of the wafer, and more preferably, at 0 mm (position of a wafer end 51) (see FIG. 3).

Since the zone heater 15 in the zone 2 and the zone heater 16 in the zone 3 are physically separately formed, it is impossible to completely coincide the divided position between the zone heater 15 and the zone heater 16 with the corresponding divided position of the susceptor 20. However, if each end of the zone heaters is positioned in a range of 5 to 10 mm with respect to the corresponding divided position (on the side of the wafer 50) of the susceptor 20, it is possible to control the zone heaters to obtain the heat uniformity efficiently. In the present embodiment, a distance between an inner end 18 of the zone heater 16 and a wafer side end 28 of a divided susceptor 23 is in a range of 5 to 10 mm.

Figure 3:
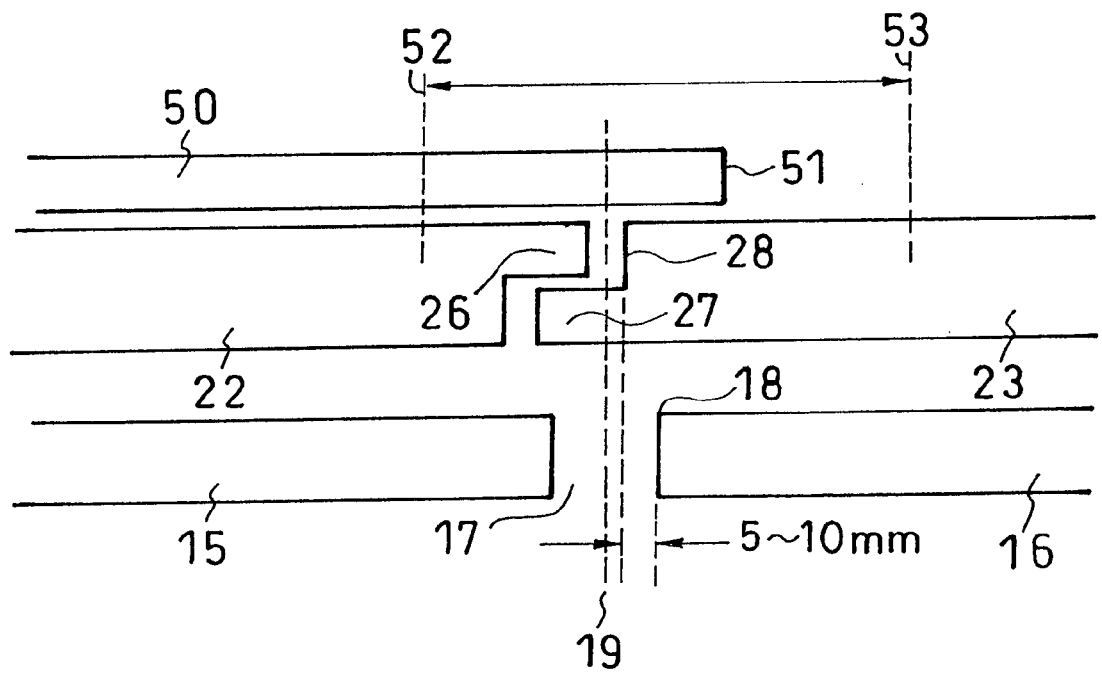
FIG. 3 is a partially enlarged schematic longitudinal sectional view for explaining the semiconductor wafer processing apparatus according to the one embodiment of the present invention.

As shown in FIG. 3, an engaging member 27 is provided at the lower side (on the side of the heater 10) of the inner

TABLE 1

| No. | Number of divisions | Number of zones | Zone 1 | Zone 2 | Zone 3 | Temperature difference of wafer (max-min) |
|---|---|---|---|---|---|---|
| 1 | 2 | 3 | ~φ180 mm | ~φ260 mm | ~φ340 mm | 4.2° C. |
| 2 | 2 | 3 | ~φ180 mm | ~φ280 mm | ~φ340 mm | 1.6° C. |
| 3 | 2 | 3 | ~φ180 mm | ~φ290 mm | ~φ340 mm | 0.9° C. (±0.45° C.) |
| 4 | 2 | 3 | ~φ180 mm | ~φ295 mm | ~φ340 mm | 0.8° C. (±0.4° C.) |
| 5 | 2 | 3 | ~φ180 mm | ~φ297 mm | ~φ340 mm | 0.5° C. (±0.25° C.) |
| 6 | 2 | 3 | ~φ180 mm | ~φ300 mm | ~φ340 mm | 0.2° C. (±0.1° C.) |
| 7 | 2 | 3 | ~φ180 mm | ~φ306 mm | ~φ340 mm | 0.9° C. (±0.45° C.) |
| 8 | 2 | 3 | ~φ180 mm | ~φ310 mm | ~φ340 mm | 1.1° C. |
| 9 | 2 | 3 | ~φ180 mm | ~φ320 mm | ~φ340 mm | 1.5° C. |
| 10 | 2 | 3 | ~φ180 mm | ~φ330 mm | ~φ340 mm | 2.3° C. |

In Table 1, the column of the zone 1 represents a diameter of the zone heater 14 in zone 1, and the column of the zone 3 represents an outer peripheral diameter of the zone heater 16 in zone 3. The column of the zone 2 represents a value of a diameter of a position where the zone heater 15 in the zone 2 and the zone heater 16 in the zone 3 are divided. Here, the divided position between the zone heater 15 and the zone heater 16 is a center position 19 of a gap 17 between the zone heater 15 and the zone heater 16. That the number of divisions is two means that the heater is physically divided into two and here, the zones 1 and 2 are physically divided from the zone 3. The results shown in Table 1 are obtained under a condition that a wafer having a diameter of end of the outer peripheral divided susceptor 23, an engaging member 26 is provided at the upper side (on the side of the wafer 50) of the outer end of the inner side divided susceptor 22, and the engaging member 26 is superposed on the engaging member 27, thereby coupling the divided susceptor 23 and the divided susceptor 22. The reason why the divided susceptors are engaged with each other with such a structure is to support the susceptors and to prevent heat from leaking in the vertical direction at the divided position.

The outer peripheral zone heater 16 and the outer peripheral divided susceptors 23 and 24 are for complementing heat escaping from an end of the wafer 50. Since heat escapes also from the susceptor, a material of the susceptor should have low thermal conductivity and low emissivity. In this structure, quartz is used for the outer peripheral divided susceptor 24. Because quartz has about 1/20 of thermal conductivity of SiC or Si, heat is restrained from being transmitted from a high-temperature susceptor toward a low-temperature side wall 31 of a susceptor support member 30. Therefore it is possible to prevent a temperature of an outer periphery of the wafer 50 (susceptor 20) from being lowered. Further, an escape of heat is further reduced and a heat insulating effect is further enhanced by covering the outer peripheral divided susceptors 23 and 24 with susceptor covers 25 made of quartz, which contributes to reduction in output of the zone heaters 16. The inner divided susceptors 21, 22 and the outer peripheral divided susceptor 23 are SiC coated carbon.

The reason why the outer peripheral divided susceptor 23 is not made of quartz but is coated with SiC coated carbon is that if the susceptor 23 which is adjacent to the wafer is made of quartz, great power is required to heat the susceptor 23, and it is difficult to control the heat uniformity over the entire surface of the wafer. Therefore, the susceptor 23 is not made of quartz but is made of carbon.

Figure 4:
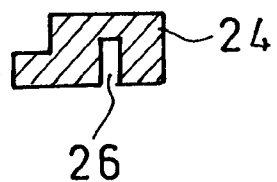
FIG. 4 is a schematic longitudinal sectional view for explaining a susceptor of the semiconductor wafer processing apparatus according to the one embodiment of the present invention.

As another example of the outer peripheral susceptor 24, if a groove 26 is provided as shown in FIG. 4, heat conduction can be restrained more efficiently.

In order to obtain better uniformity over the entire surface of the wafer, a structure in which the wafer 50 (susceptor 20) and the heater 10 are relatively rotated is employed. In this structure, a support member 35 of the heater 10 is used as a stationary shaft, the support member 30 of the susceptor 20 on which the wafer 50 is placed is used as a rotation shaft, and the support member 30 is coupled to a rotation introducing mechanism 39 using magnet coupling. Electrical wiring to the heater 10 and the like is taken into account and thus, the heater 10 is fixed and the susceptor 20 is rotated.

According to the above-mentioned embodiment of the present invention, it is possible to enhance the heat uniformity over the entire surface of the wafer, and to reduce the cost by optimizing the size of the heater 10 and by extension the heater unit 60.

In the present embodiment, the term "processing" includes forming doped polycrystalline silicon film for a gate electrode of a MOS transistor, and forming a nitride film or tantalum film (insulation film) for capacitor of a MOS transistor.

The entire disclosure of Japanese Patent Application No. 2000-354366 filed on Nov. 21, 2000 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus for heating a substrate by a heater through a susceptor in a state in which said substrate is placed on said susceptor, thereby processing said substrate, wherein said heater is divided into a plurality of respectively controlled zone heaters to form gaps therebetween, a center position of a gap of said gaps which is positioned closer to an end of said substrate than any other gap is located in a range from an inner side 10 mm to an outer side 6 mm in a radial direction of said substrate with respect to the end of said substrate.

2. A substrate processing apparatus as recited in claim 1, wherein the center position of the gap is located in a range of an inner side 5 mm to the end of said substrate in the radial direction of said substrate with respect to the end of said substrate.

3. A substrate processing apparatus as recited in claim 1, wherein the center position of the gap is located at the end of said substrate.

4. A substrate processing apparatus as recited in claim 1, wherein said susceptor is divided into a plurality of divided susceptors, and divided ends of said zone heaters are respectively located in a range of 5 to 10 mm from the divided ends on the substrate side of the respectively corresponding divided susceptors.

5. A substrate processing apparatus as recited in claim 1, wherein said divided susceptors have an outer peripheral susceptor which is to be located at an outer periphery of said substrate, and a member made of quartz is provided on or above said outer peripheral susceptor.

6. A producing method of a semiconductor device, comprising a step of heating a substrate by a heater through a susceptor in a state in which said substrate is placed on said susceptor, thereby processing said substrate, wherein said heater is divided into a plurality of respectively controlled zone heaters to form gaps therebetween, a center position of a gap of said gaps which is positioned closer to an end of said substrate than any other gap is located in a range from an inner side 10 mm to an outer side 6 mm in a radial direction of said substrate with respect to the end of said substrate.

7. A substrate processing apparatus for heating a substrate by a heater through a susceptor in a state in which said substrate is placed on said susceptor, thereby processing said substrate, wherein said heater is divided into a plurality of respectively controlled zone heaters to form gaps therebetween, said susceptor is divided into a plurality of divided susceptors, and divided ends of said zone heaters are respectively located in a range of 5 to 10 mm from the divided ends on the substrate side of the respectively corresponding divided susceptors.

* * * * *